(12) United States Patent
Wang et al.

(10) Patent No.: US 11,112,659 B2
(45) Date of Patent: Sep. 7, 2021

(54) ARRAY SUBSTRATE AND DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Guohua Wang, Beijing (CN); Wenming Ren, Beijing (CN); Fei Gao, Beijing (CN)

(73) Assignees: HEFEI XINSHENG OPTOELECTRONICS TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 142 days.

(21) Appl. No.: 16/474,527

(22) PCT Filed: Jun. 28, 2018

(86) PCT No.: PCT/CN2018/093451
§ 371 (c)(1),
(2) Date: Jun. 27, 2019

(87) PCT Pub. No.: WO2019/042002
PCT Pub. Date: Mar. 7, 2019

(65) Prior Publication Data
US 2019/0361303 A1 Nov. 28, 2019

(30) Foreign Application Priority Data
Aug. 31, 2017 (CN) .......................... 201710778808.6

(51) Int. Cl.
*G02F 1/136* (2006.01)
*G02F 1/1362* (2006.01)
(Continued)

(52) U.S. Cl.
CPC .. *G02F 1/136204* (2013.01); *G02F 1/136286* (2013.01); *H01L 27/124* (2013.01); *G02F 1/133784* (2013.01)

(58) Field of Classification Search
CPC .................................................. G02F 1/136204
See application file for complete search history.

(56) References Cited

U.S. PATENT DOCUMENTS 5,598,283 A * 1/1997 Fujii ..................... G02F 1/1345
349/143
2012/0206684 A1 8/2012 Lee et al.
(Continued)

FOREIGN PATENT DOCUMENTS

| CN | 1540396 A | 10/2004 |
|---|---|---|
| CN | 100349038 C | 11/2007 |

(Continued)

OTHER PUBLICATIONS

International Search Report and Written Opinion issued in corresponding International Application No. PCT/CN2018/093451, dated Aug. 24, 2018, with English translation.
(Continued)

*Primary Examiner* — Thao X Le
*Assistant Examiner* — Laura M Dykes
(74) *Attorney, Agent, or Firm* — McDermott Will and Emery LLP

(57) ABSTRACT

An array substrate includes a display region and a wiring region. The wiring region includes a plurality of sets of signal line leads and a plurality of wiring regions, and a same set of signal line leads extends to a same bonding region disposed in the wiring region. The wiring region further includes at least one auxiliary wiring structure. Each auxiliary wiring structure is disposed between adjacent two sets of signal line leads and includes a peripheral closed wiring
(Continued)

loop. Each peripheral closed wiring loop includes a plurality of corner portion, and a shape of at least one corner portion proximate to the display region is a curve.

17 Claims, 7 Drawing Sheets

(51) Int. Cl.
*H01L 27/12* (2006.01)
*G02F 1/1337* (2006.01)

(56) References Cited

U.S. PATENT DOCUMENTS

| | | | |
|---|---|---|---|
| 2013/0187838 A1* | 7/2013 | Kiriyama | H01J 11/12 345/60 |
| 2014/0375262 A1* | 12/2014 | Yamaguchi | H01Q 1/38 320/108 |
| 2015/0255409 A1 | 9/2015 | Lee et al. | |
| 2015/0346570 A1 | 12/2015 | Choi et al. | |
| 2016/0027372 A1 | 1/2016 | Yan | |
| 2019/0361303 A1 | 11/2019 | Wang et al. | |

FOREIGN PATENT DOCUMENTS

| | | |
|---|---|---|
| CN | 102636925 A | 8/2012 |
| CN | 103698953 A | 4/2014 |
| CN | 104570493 A | 4/2015 |
| CN | 105158981 A | 12/2015 |
| CN | 107479285 A | 12/2017 |
| KR | 10-2008-0063627 A | 7/2008 |

OTHER PUBLICATIONS

Office Action issued in corresponding Chinese Application No. 201710778808.6, dated Oct. 31, 2019, with English translation.

* cited by examiner

ARRAY SUBSTRATE AND DISPLAY DEVICE

CROSS-REFERENCE TO RELATED APPLICATION

This application is a national phase entry under 35 USC 371 of International Patent Application No. PCT/CN2018/093451 filed on Jun. 28, 2018, which claims priority to Chinese Patent Application No. 201710778808.6, filed with the Chinese Patent Office on Aug. 31, 2017, titled "ARRAY SUBSTRATE AND DISPLAY DEVICE", which are incorporated herein by reference in their entirety.

TECHNICAL FIELD

The present disclosure relates to the field of display technologies, and in particular, to an array substrate and a display device.

BACKGROUND

Thin film transistor liquid crystal display (TFT-LCD) is increasingly used in the high-performance display field due to its small size, low power consumption, no radiation, and relatively low manufacturing cost.

SUMMARY

Some embodiments of the present disclosure provide an array substrate, and the array substrate includes a display region and a wiring region. The wiring region includes a plurality of sets of signal line leads, and a same set of signal line leads extends to a corresponding bonding region disposed in the wiring region. The wiring region further includes auxiliary wiring structure(s) each disposed between adjacent two sets of signal line leads. Each auxiliary wiring structure includes a peripheral closed wiring loop. The peripheral closed wiring loop includes at least one corner portion, and a shape of at least one of the at least one corner portion proximate to the display region is a curved shape.

In some embodiments, a shape of all of the at least one corner portion of the peripheral closed wiring loop is a curved shape.

In some embodiments, the peripheral closed wiring loop includes at least three peripheral wires sequentially coupled.

In some embodiments, each auxiliary wiring structure further includes interior wires disposed inside the peripheral closed wiring loop, and the peripheral closed wiring loop is provided with at least one tip facing the interior wires.

In some embodiments, the at least three peripheral wires of the peripheral closed wiring loop include a first peripheral wire proximate to the display region of the array substrate. The first peripheral wire is provided with the at least one tip.

In some embodiments, the first peripheral wire is parallel to an arrangement direction of bonding regions.

In some embodiments, the at least three peripheral wires of the peripheral closed wiring loop are four peripheral wires. The four peripheral wires include a second peripheral wire disposed parallel to the first peripheral wire, and a third peripheral wire and a fourth peripheral wire disposed on two sides of the first peripheral wire and the second peripheral wire and the third peripheral wire and the fourth peripheral wire are disposed opposite to each other. The third peripheral wire is disposed parallel to a signal line lead of a set of signal line leads closest to the auxiliary wiring structure, the fourth peripheral wire is disposed parallel to a signal line lead of another set of signal line leads closest to the auxiliary wiring structure, and the two sets of signal line leads are proximate to each other.

In some embodiments, the interior wires include at least one first interior wire. Each first interior wire includes second interior sub-wire(s) directly connected to the peripheral closed wiring loop, and a first interior sub-wire disconnected from each second interior sub-wire. The first interior sub-wire is disposed parallel to the first peripheral wire, and the first interior sub-wire is disposed at least directly opposite to at least a portion of the first peripheral wire where the at least one tip is disposed. Each first interior wire further includes at least one conductive connecting portion. In each first interior wire, the first interior sub-wire and a second interior sub-wire(s) are coupled through one conductive connecting portion.

In some embodiments, the first interior sub-wire of the first interior wire is disposed proximate to the first peripheral wire.

In some embodiments, the at least one first interior wire includes at least two second interior sub-wires, and in the first interior wire, one end of the first interior sub-wire is coupled to one second interior sub-wire through a conductive connecting portion, and another end of the first interior sub-wire is coupled to another second interior sub-wire through another conductive connecting portion.

In some embodiments, the conductive connecting portion is mainly made of a transparent conductive material.

In some embodiments, the first peripheral wire is provided with a plurality of tips.

Some embodiments of the present disclosure provide a display device, and the display device includes the array substrate.

In some embodiments, each tip is a protruding structure disposed on the peripheral closed wiring loop.

In some embodiments, each auxiliary wiring structure further includes interior wires disposed inside the peripheral closed wiring loop. The peripheral closed wiring loop includes at least one tip facing the interior wires.

In some embodiments, the at least three peripheral wires of the peripheral closed wiring loop include a first peripheral wire proximate to the display region of the array substrate. The first peripheral wire includes the at least one tip.

In some embodiments, the interior wires include at least one first interior wire. Each first interior wire includes second interior sub-wire(s) directly connected to the peripheral closed wiring loop, and a first interior sub-wire disconnected from each second interior sub-wire; and the first interior sub-wire is disposed parallel to the first peripheral wire. The first interior sub-wire is disposed at least directly opposite to at least a tip of the first peripheral wire; and each first interior wire further includes at least one conductive connecting portion. In each first interior wire, the first interior sub-wire and a second interior sub-wire proximate to the first interior sub-wire are coupled through one conductive connecting portion.

In some embodiments, each tip is a bent structure of the peripheral closed wiring loop.

In some embodiments, in the at least one peripheral closed wiring loop, a length of the first peripheral wire is less than a length of the second peripheral wire.

In some embodiments, a resistivity of at least one of the at least one conductive connecting portion is greater than a resistivity of the first interior wire.

BRIEF DESCRIPTION OF THE DRAWINGS

In order to describe technical solutions in embodiments of the present disclosure or in the related art more clearly, the accompanying drawings to be used in the description of the embodiments or the related art will be introduced briefly. Obviously, the accompanying drawings to be described below are merely some embodiments of the present disclosure, and a person of ordinary skill in the art can obtain other drawings according to these drawings without paying any creative effort.

FIG. 4a is a schematic diagram showing a partial structure of FIG. 3a;

DETAILED DESCRIPTION

The technical solutions in embodiments of the present disclosure will be described clearly and completely with reference to the accompanying drawings. Obviously, the described embodiments are merely some but not all of embodiments of the present disclosure. All other embodiments made on the basis of the embodiments of the present disclosure by a person of ordinary skill in the art without paying any creative effort shall be included in the protection scope of the present disclosure.

Figure 1:
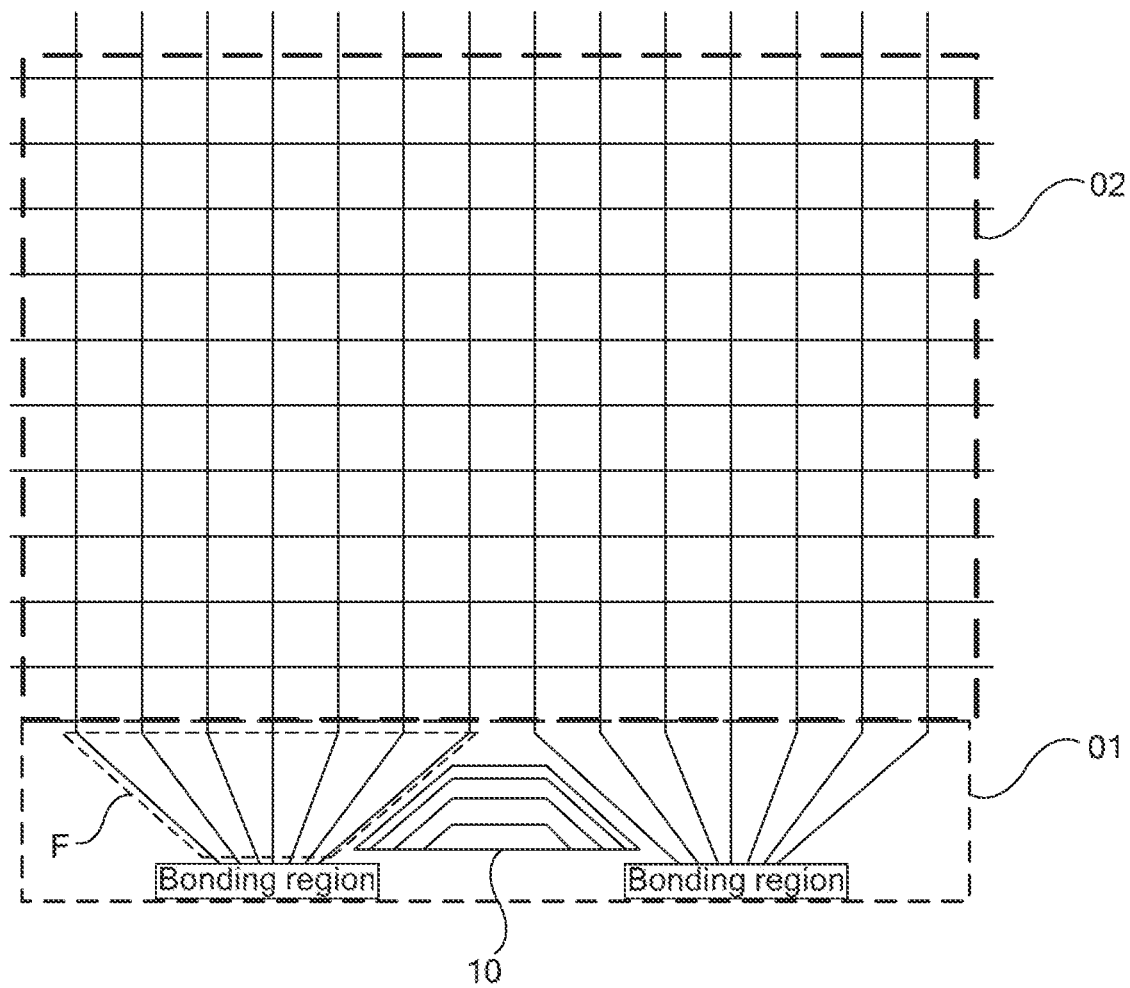
FIG. 1 is a schematic diagram showing a structure of an array substrate in the related art.

As shown in FIG. 1, a liquid crystal display device is divided into a wiring region 01 and a display region 02, and the display region 02 includes an alignment film for aligning liquid crystal molecules in a liquid crystal layer. The wiring region 01 is provided with a plurality of bonding regions connected to fanout wiring structures F, that is, each fanout wiring structures F corresponds one bonding region. The alignment film is generally produced by using a rubbing alignment process, that is, by rolling a friction roller, so that alignment grooves are formed on the alignment film.

As shown in FIG. 1, an auxiliary wiring structure 10 is generally disposed in an region between adjacent two fanout wiring structures F, so as to avoid a rub mura caused by an excessive difference in height between the region between the adjacent fanout wiring structures F and a surrounding region when the friction roller rolls from the display region 02 to the wiring region 01.

Figure 2:
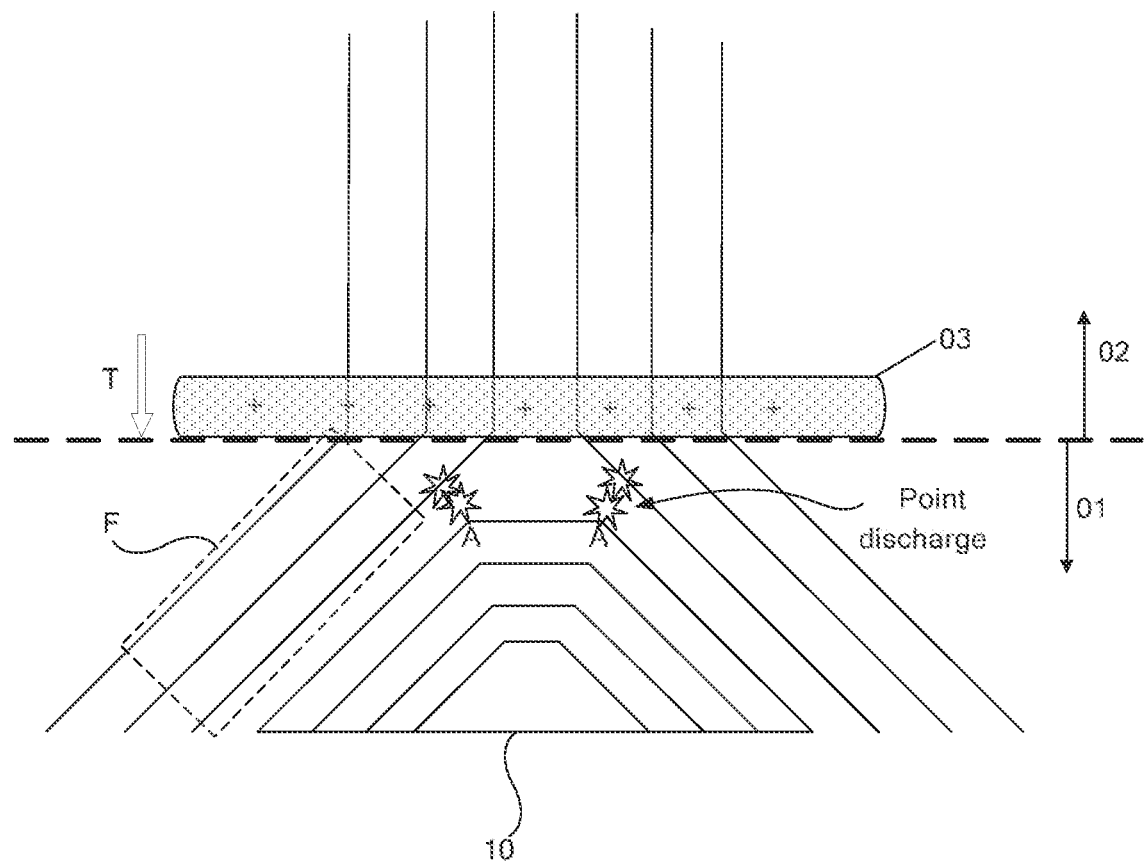
FIG. 2 is a schematic diagram showing a partial structure of the array substrate in FIG. 1.

However, as shown in FIG. 2, since the alignment film has a high impedance, which may be regarded as an insulating plastic, electric charges generated caused by frictions are easily accumulated on a surface of the friction roller 03. As a result, when the friction roller 03 rolls from the display region 02 to the wiring region 01 in a direction T, the electric charges on the surface of the friction roller 03 will be transferred to the auxiliary wiring structure 10, which easily causes point discharges at corner portions A of the auxiliary wiring structure 10. A relatively large current will be generated at a moment of the discharge, and the current will be transmitted to the display region 02 through wires in the fanout wiring structure F (only a portion of the fanout wiring structure F is shown in FIG. 2), thereby causing an abnormal display or a display mura of a display device during a normal display of an image.

Figure 3A:
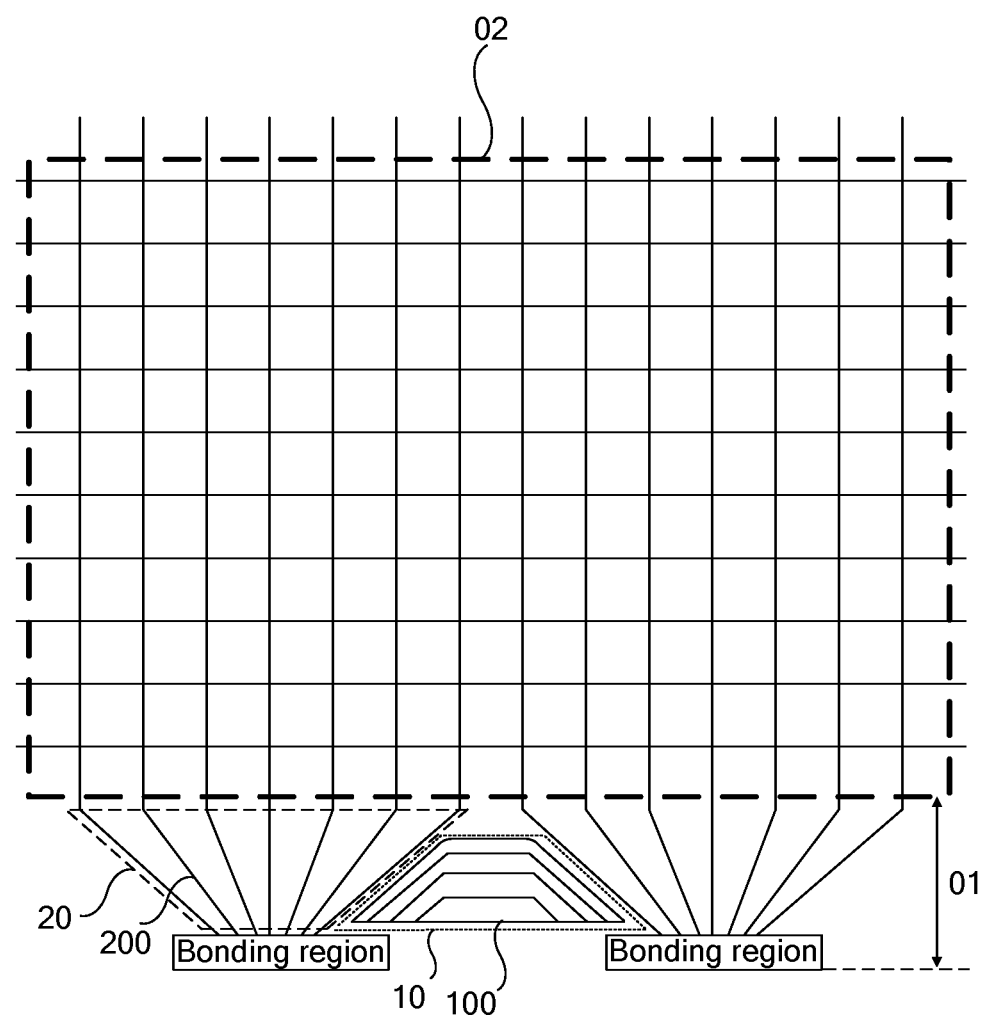
FIG. 3a is a schematic diagram showing a structure of an array substrate, in accordance with some embodiments of the present disclosure.
Figure 3B:
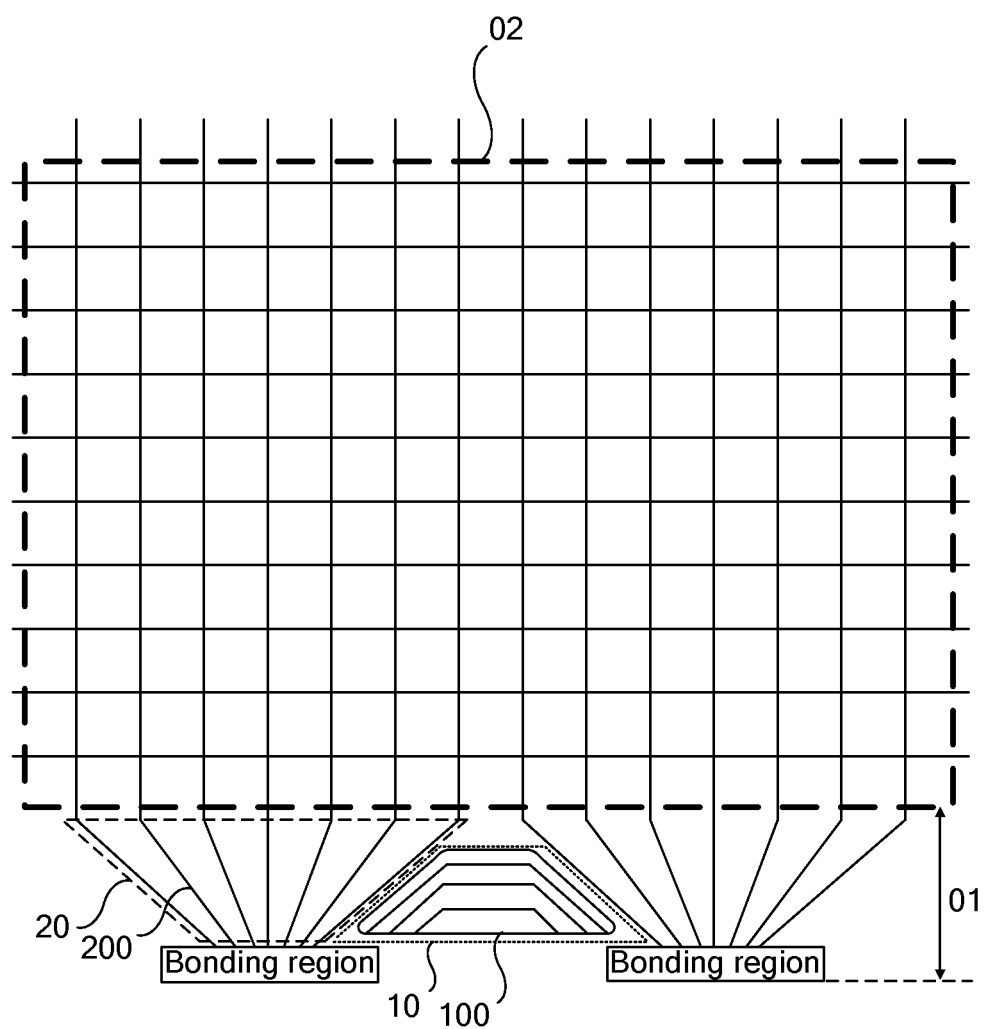
FIG. 3b is a schematic diagram showing a structure of another array substrate, in accordance with some embodiments of the present disclosure.

Some embodiments of the present disclosure provide an array substrate. As shown in FIG. 3a and FIG. 3b, the array substrate includes a display region 02 and a wiring region 01. The wiring region 01 includes a plurality of sets of signal line leads 200, and a same set of signal line leads 200 extends to a same bonding region disposed in the wiring region 01. It will be understood that a set of signal line leads 200 refers to a fanout wiring structure formed by at least two signal line leads 200, and one fanout wiring structure is disposed in one fanout wiring region 20 of the array substrate. That is to say, the same set of signal line leads 200 extends to the same bonding region. With regard to two different sets of signal line leads 200, one set of signal line leads 200 extends to one binding region and another extends to another bonding region.

Figure 4A:
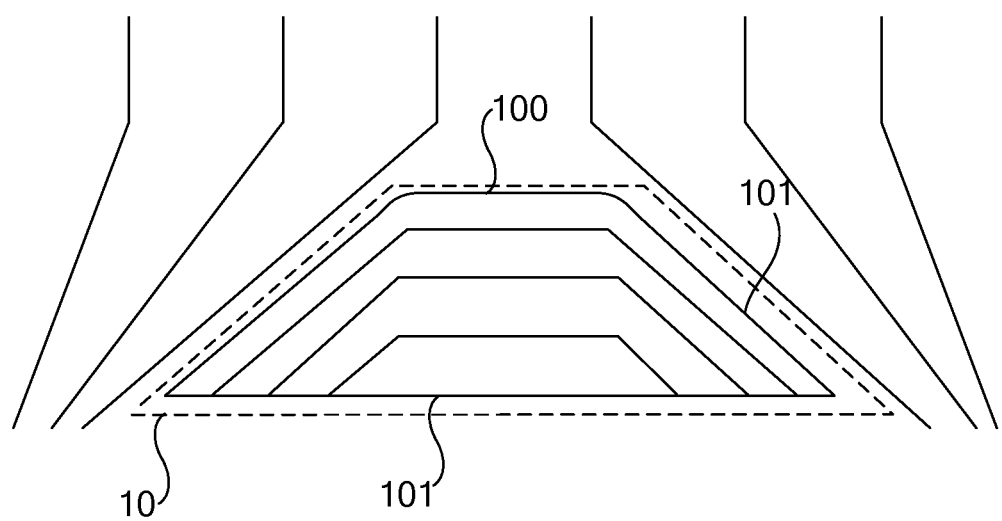

As shown in FIG. 3a and FIG. 3b, the wiring region 01 further includes at least one auxiliary wiring structure 10 each disposed between adjacent sets of signal line leads 200, i.e., the auxiliary wiring structure 10 is located between adjacent fanout wiring regions 20. As shown in FIG. 4a (a partial enlargement diagram of FIG. 3a) and FIG. 4b (a partial enlargement diagram of FIG. 3b), the auxiliary wiring structure 10 includes a peripheral closed wiring loop 100 disposed at an outermost side of the auxiliary wiring structure 10, and at least one corner portion of the peripheral closed wiring loop 100 proximate to the display region 02 adopts a smooth transition curve.

It will be understood herein that, one auxiliary wiring structure 10 is disposed between any two adjacent sets of signal line leads 200.

Furthermore, with regard to the liquid crystal display device, references may be made to FIG. 1, FIG. 2 and corresponding text descriptions. The array substrate is provided with the alignment film, and the alignment film is generally produced by using the rubbing alignment process, which causes that the electric charges are accumulated on the surface of the friction roller 03 during a manufacturing process. When the friction roller 03 rolls from the display region 02 to the wiring region 01 in the direction T, the friction roller 03 will be first in contact with a peripheral wire, which is in the auxiliary wiring structure 10 and is proximate to the display region 02. That is, the friction roller 03 will be first in contact with the peripheral wire, which is in the peripheral closed wiring loop 100 and is proximate to the display region 02.

In the array substrate provided by some embodiments of the present disclosure, at least one corner portion of the peripheral closed wiring loop 100 proximate to the display region 02 is configured to adopt a smooth transition curve, so that there is no tip at the corner portion proximate to the display region 02. In this way, when the friction roller 03 rolls to an edge of the wiring region 01 proximate to the display region 02, since the electric charges are first accumulated on the peripheral wire of the peripheral closed wiring loop 100 of the auxiliary wiring structure proximate to the display region 02, and there is no condition for the point discharge at the corner portion of the peripheral closed wiring loop 100 proximate to the display region 02, so that a probability of an occurrence of the point discharge at the corner portion of the auxiliary wiring structure 10 proximate to the display region 02 is reduced. That is, a probability of adversely affecting the display region due to that the auxiliary wiring structure 10 performs the point discharge on adjacent signal line lead(s) 200 is reduced.

Figure 4B:
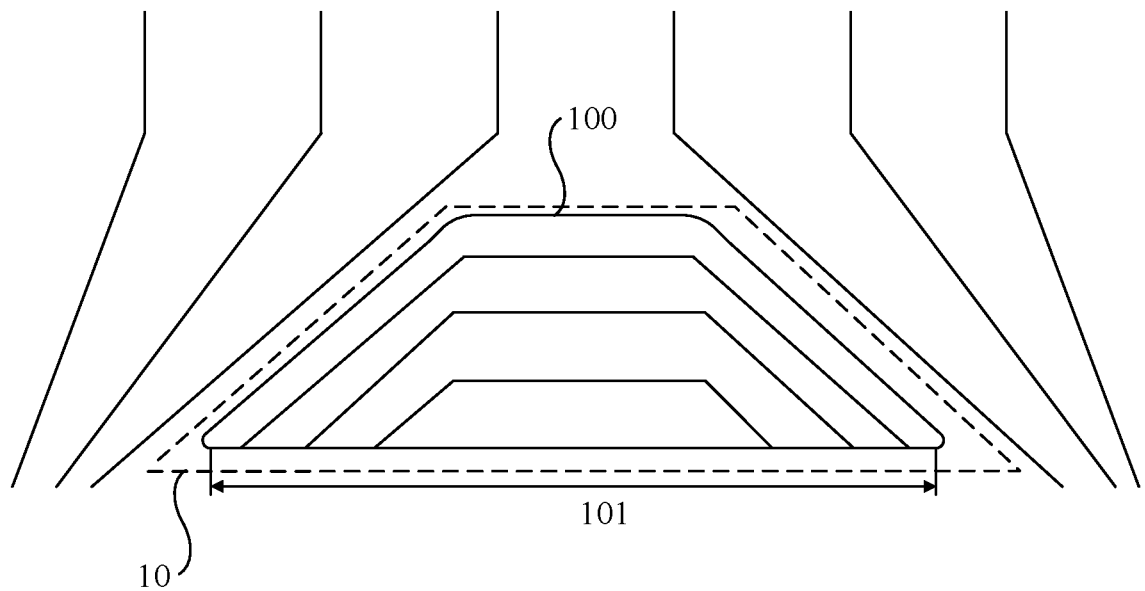
FIG. 4b is a schematic diagram showing a partial structure of FIG. 3b.

In some embodiments, as shown in FIG. 3b and FIG. 4b, all of the corner portions of the peripheral closed wiring loop 100 adopt the smooth transition curves, thereby further reducing the probability of the occurrence of point discharges at the corner portions of the auxiliary wiring structure 10.

In some embodiments, as shown in FIG. 4a and FIG. 4b, the peripheral closed wiring loop 100 is formed by sequentially coupling at least three peripheral wires 101, and corner portions of the peripheral closed wiring loop 100 adopt the smooth connecting curves.

In some embodiments, a shape of the peripheral closed wiring loop 100 is a triangle mainly formed by sequentially coupling three straight peripheral wires 101, and corner portions of the triangle adopt smooth connecting curves. In some other embodiments, the shape of the peripheral closed wiring loop 100 is a quadrangle mainly formed by sequentially coupling four straight peripheral wires 101, and corner portions of the quadrangle adopt smooth connecting curves. In yet some other embodiments, the shape of the peripheral closed wiring loop 100 is a pentagon mainly formed by sequentially coupling five straight peripheral wires 101, and corner portions of the pentagon adopt smooth connecting curves. In yet some other embodiments, the shape of the peripheral closed wiring loop 100 is a hexagon mainly formed by sequentially coupling six rectilinear peripheral wires 101, and corner portions of the hexagon adopt smooth connecting curves.

It will be noted that, with regard to a structure of the peripheral closed wiring loop 100 formed by sequentially coupling at least three peripheral wires 101, any adjacent two peripheral wires 101 are necessarily non-parallel, that is, there is a corner portion at a junction of two adjacent peripheral wires 101.

In addition, slopes of tangents of all points on the curve in the description that corner portions adopt smooth connecting curves are sequentially and progressively changed from a slope of one peripheral wire 101 of two peripheral wires 101 coupled at a corner portion to a slope of another peripheral wire 101. In some embodiments, the curve is a circular curve (the curve is a curve on a corresponding ellipse). In some other embodiments, the curve is an elliptical curve. In yet some other embodiments, the curve has other shapes. The embodiments of the present disclosure do not limit a shape of any one curve, as long as it is ensured that the two peripheral wires 101 are smoothly coupled at the corner portion by using the curve.

Figure 5:
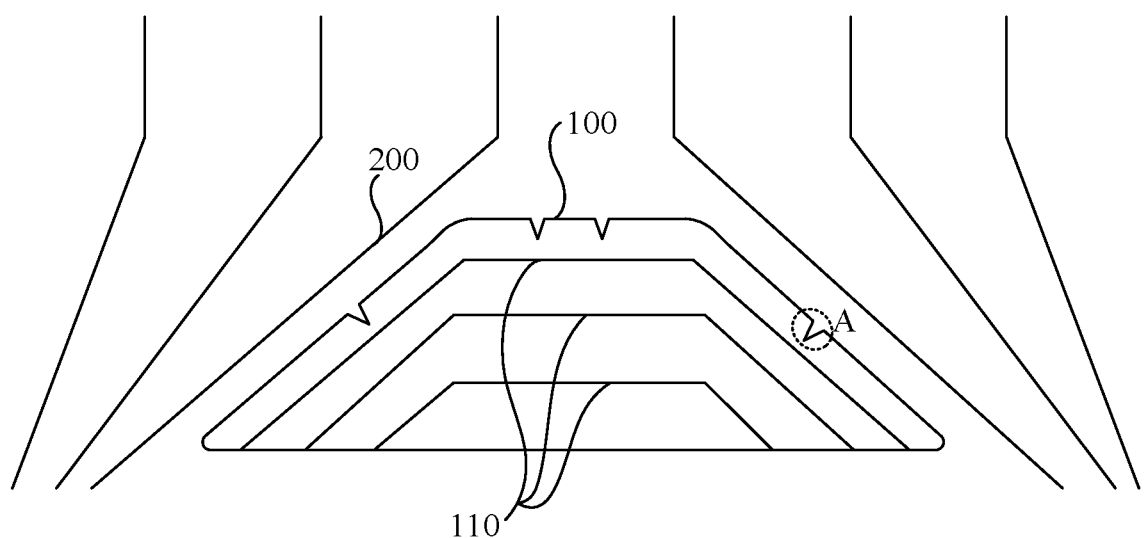
FIG. 5 is a schematic diagram showing a partial structure of an array substrate, in accordance with some embodiments of the present disclosure.

In order to further avoid adverse effects on the array substrate due to hidden trouble due to an accumulation of the electric charges, in some embodiments, as shown in FIG. 5, the auxiliary wiring structure 10 further includes interior wires 110 disposed inside the peripheral closed wiring loop 100. The peripheral closed wiring loop 100 is provided with at least one tip A facing the interior wires 110, so that the point discharge can be generated between the at least one tip A and the interior wires 110.

When there are electric charges accumulated on the peripheral closed wiring loop 100, since a density of the electric charges is larger at the at least one tip A, an electric field near a position of each tip A is enhanced, so that the peripheral closed wiring loop 100 is caused to generate the point discharge between the at least one tip A and the interior wires 110. As a result, the electric charges on the peripheral closed wiring loop 100 are consumed through the point discharge, thereby reducing the adverse effects due to the accumulation of the electric charges.

Figure 6:
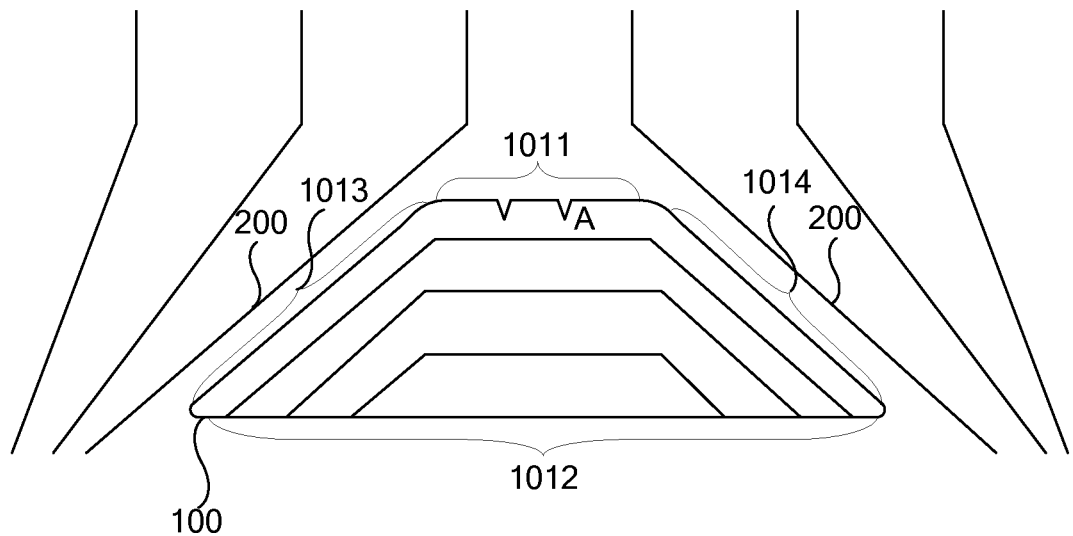
FIG. 6 is a schematic diagram showing a partial structure of another array substrate, in accordance with some embodiments of the present disclosure.

Since in a process of manufacturing the alignment film, the friction roller 03 will be first in contact with the peripheral wire of the peripheral closed wiring loop 100 proximate to the display region 02, in order to consume the electric charges through the point discharge of each tip A, in some embodiments, as shown in FIG. 6, in the auxiliary wiring structure 10, the at least three peripheral wires 101 of the peripheral closed wiring loop 100 include a first peripheral wire 1011 proximate to the display region 02 of the array substrate, and the first peripheral wire 1011 is provided with at least one tip A.

Based on this, when the friction roller 03 rolls to the wiring region 01 from the display region 02 in the direction T, the friction roller 03 will be in direct contact with the first peripheral wire 1011, so that the point discharge of the electric charges having a larger density on the surface of the friction roller 03 is easier to be generated through the at least one tip A on the first peripheral wire 1011, and the electric charges are effectively consumed through the point discharge, thereby avoiding a smaller density of the electric charges accumulated on the at least one tip A due to that the electric charges accumulated on the surface of the friction roller 03 are uniformly dispersed on the peripheral closed wiring loop 100, which is disadvantageous for a consumption of the electric charges through the point discharge of each tip A.

In some embodiments, the first peripheral wire 1011 is parallel to an arrangement direction of the plurality of bonding regions.

It will be noted that, a person skilled in the art will understand that the arrangement direction of the plurality of bonding regions is an arrangement direction of the plurality of bonding regions corresponding to a same type of signal line leads (for example, data line leads or gate line leads) in the array substrate, which are generally arranged in an extending direction of a gate line or a data line. In this case, the description that the first peripheral wire 1011 is parallel to an arrangement direction of the plurality of bonding regions also means that an extending direction of the first peripheral wire 1011 is consistent with the extending direction of the gate line or the data line. For example, the data line lead is configured to be connected with the data line, since an arrangement direction of a plurality of bonding regions corresponding to the data line leads is perpendicular to the extending direction of the data line, and the extending directions of the data line and the gate line are perpendicular to each other, the plurality of bonding regions are generally arranged in the extending direction of the gate line. In this case, the first peripheral wire 1011 is parallel to the arrangement direction of the plurality of bonding regions, and is also parallel to the extending direction of the gate line. For another example, the gate line lead is configured to be connected with the gate line, since an arrangement direction of a plurality of bonding regions corresponding to the gate line leads is perpendicular to the extending direction of the gate line, and the extending directions of the gate line and the data line are perpendicular to each other, the plurality of bonding regions are generally arranged in the extending direction of the data line. In this case, the first peripheral wire 1011 is parallel to the arrangement direction of the plurality of bonding regions, and is also parallel to the extending direction of the data line.

In some embodiments, as shown in FIG. 6, the peripheral closed wiring loop 100 is formed by four peripheral wires in an actual manufacturing process. The four peripheral wires include a second peripheral wire 1012 disposed parallel to the first peripheral wire 1011, and a third peripheral wire 1013 and a fourth peripheral wire 1014 disposed at two sides of the first peripheral wire 1011 and the second peripheral wire 1012. The third peripheral wire 1013 is disposed parallel to a signal line lead 200 of a set of signal line leads closest to the auxiliary wiring structure 10, the fourth peripheral wire 1014 is disposed parallel to a signal line lead 200 of another set of signal line leads closest to the auxiliary wiring structure 10, and the two sets of signal line leads are proximate to each other.

In the peripheral closed wiring loop, a length of the first peripheral wire is less than a length of the second peripheral wire, that is, the four peripheral wires are sequentially coupled to form the peripheral closed wiring loop 100 having a shape similar to a trapezoid. A shorter bottom edge of the peripheral closed wiring loop 100 having a shape similar to a trapezoid corresponds to the first peripheral wire 1011, and another longer bottom edge corresponds to the second peripheral wire 1012 and is disposed parallel to the first peripheral wire 1011. The third peripheral wire 1013 and the fourth peripheral wire 1014 correspond to two side edges of the peripheral closed wiring loop 100 having a shape similar to a trapezoid and are disposed parallel to closest signal line leads 200, respectively. The auxiliary wiring structure 10 will be further described below by taking the peripheral closed wiring loop 100 having a shape similar to a trapezoid as an example.

Figure 7:
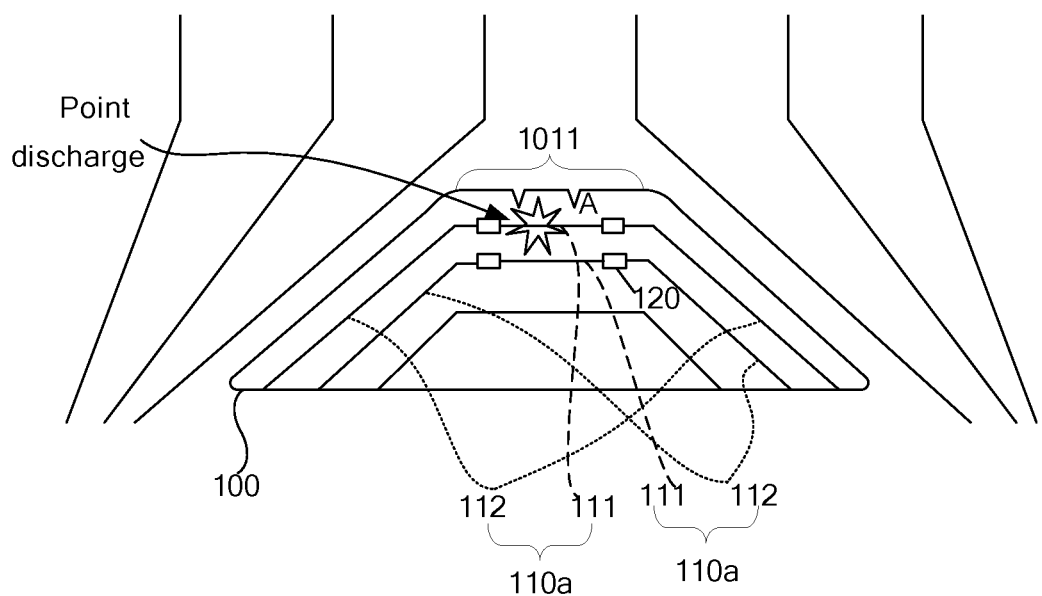
FIG. 7 is a schematic diagram showing a partial structure of yet another array substrate, in accordance with some embodiments of the present disclosure.

Based on this, in order to further consume the electric charges on the auxiliary wiring structure 10, as shown in FIG. 7, the interior wires 110 include at least one first interior wire 110a. Each first interior wire 110a includes at least one second interior sub-wire 112 directly connected to the peripheral closed wiring loop 100 and a first interior sub-wire 111 disconnected from the second interior sub-wires 112. It will be understood herein that, each of two ends of the first interior sub-wire 111 is disconnected from the peripheral closed wiring loop 100 and the at least one second interior sub-wire 112. In addition, the at least one second interior sub-wire 112 may be a single wire or a plurality of wires, which is not specifically limited herein.

The first interior sub-wire 111 is disposed parallel to the first peripheral wire 1011, and the first interior sub-wire 111 is disposed at least directly opposite to at least one portion of the first peripheral wire 1011 where the at least one tip A is disposed. That is, an orthographic projection of the first interior sub-wire 111 on the first peripheral wire 1011 at least covers the at least one portion of the first peripheral wire 1011 where the at least one tip A is disposed. In addition, the first interior sub-wire 111 and the at least one second interior sub-wire 112 are coupled at at least one disconnected portion through at least one conductive connecting portion 120, and a resistivity of the at least one conductive connecting portion 120 is greater than a resistivity of the first interior wire 110a.

As a result, when the point discharge occurs at any one tip A on the first peripheral wire 1011, and a large current instantaneously generated flows through the conductive connecting portions 120, since the resistivity of the at least one conductive connecting portion 120 is greater than the resistivity of the first interior wire 110a, a great amount of heat will be generated on the at least one conductive connecting portion 120, which causes that the at least one conductive connecting portion 120 is burnt down. That is, an electrostatic breakdown will occur at the at least one conductive connecting portion 120, thereby consuming the electric charges, so that the signal line lead 200 proximate to the auxiliary wiring structure 10 is not broken down.

It will be noted that, in a case where conductive connecting portions 120 have the same shape and the same size, compared with the conductive connecting portion 120 made of a material having a smaller resistivity, the conductive connecting portion 120 made of a material having a larger resistivity may effectively ensure that this conductive connecting portion 120 has a large resistance, so that a large amount of heat is generated when the current flows through the conductive connecting portion 120, thereby the electric charges on the at least one auxiliary wiring structure are further consumed. Of course, the shape and the size of the at least one conductive connecting portion 120 need to be determined according to actual conditions (for example, a type of the array substrate, a wiring density of the wires), which are not limited herein.

In some embodiments, the at least one conductive connecting portion is mainly made of a transparent conductive material. The transparent conductive material may be, for example, indium tin oxide (ITO). Of course, considering that there are other devices mainly made of the transparent conductive material in the array substrate, in order to simplify the process, in some embodiments, the at least one conductive connecting portion 120 and other devices (for example, pixel electrodes) made of the transparent conductive material in the array substrate are manufactured in a same layer and are made of a same material. That is, they are manufactured through a same single manufacturing process.

In order to consume the electric charges on the at least one auxiliary wiring structure 10 as much as possible through the at least one conductive connecting portion 120, in some embodiments, as shown in FIG. 7, both ends of each first interior sub-wire 111 are disposed to be coupled to the second interior sub-wires 112 through the conductive connecting portions 120.

In order to ensure that the electric charge may be effectively consumed through the at least one conductive connecting portion 120, in some embodiments, as shown in FIG. 7, each first interior sub-wire 111 is disposed proximate to the first peripheral wire 1011.

It will be noted that, in a case where there is a single first interior wire 110a, in order to ensure the relatively large current generated at a moment when the point discharge occurs at each tip may be effectively consumed through the first interior wire 110a, the first interior sub-wire 111 in the first interior wire 110a needs be ensured to be disposed proximate to the first peripheral wire 1011. In a case where there are a plurality of first interior wires 110a (referring to FIG. 7), at least one of the first interior wires 110a is ensured to disposed proximate to the first peripheral wire 1011. Of course, the remaining first internal wire(s) can also be disposed proximate to the first peripheral wire 1011, but wiring structures other than the first interior wires 110a are avoided to be disposed.

In addition, with regard to the at least one tip A provided on the first peripheral wire 1011, there is a single tip in some embodiments, and there are a plurality of tips in some other embodiments. In some embodiments, in order to effectively consume the electric charges through the point discharge, a plurality of tips A are disposed on the first peripheral wire 1011. In some embodiments, the number of the plurality of tips A is two.

Figure 8:
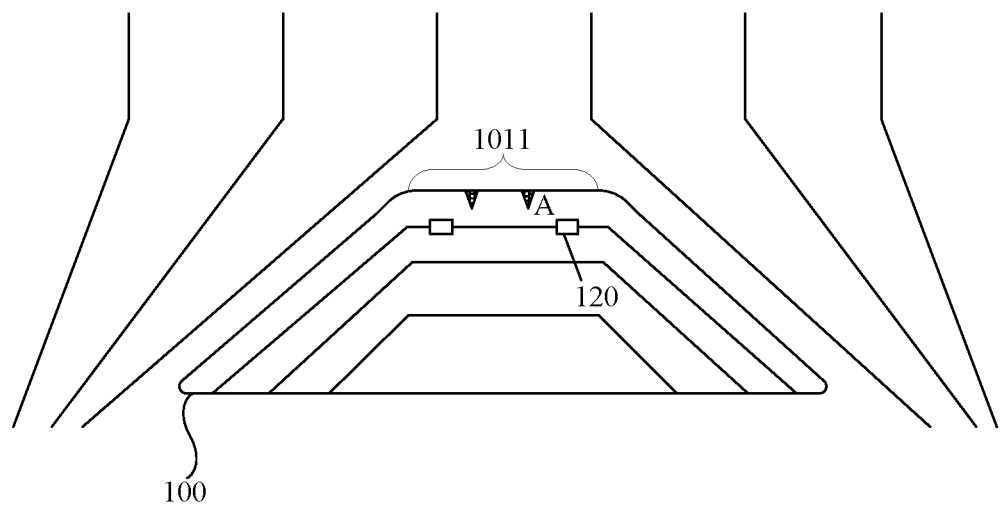
FIG. 8 is a schematic diagram showing a partial structure of yet another array substrate, in accordance with some embodiments of the present disclosure.

In some embodiments, as shown in FIG. 7, the peripheral closed wiring loop 100 is provided with at least one bent structure, and each bent structure forms a tip A. In some other embodiments, as shown in FIG. 8, the peripheral closed wiring loop is provided with at least one protruding structure, and each protruding structure forms a tip A.

Figure 9:
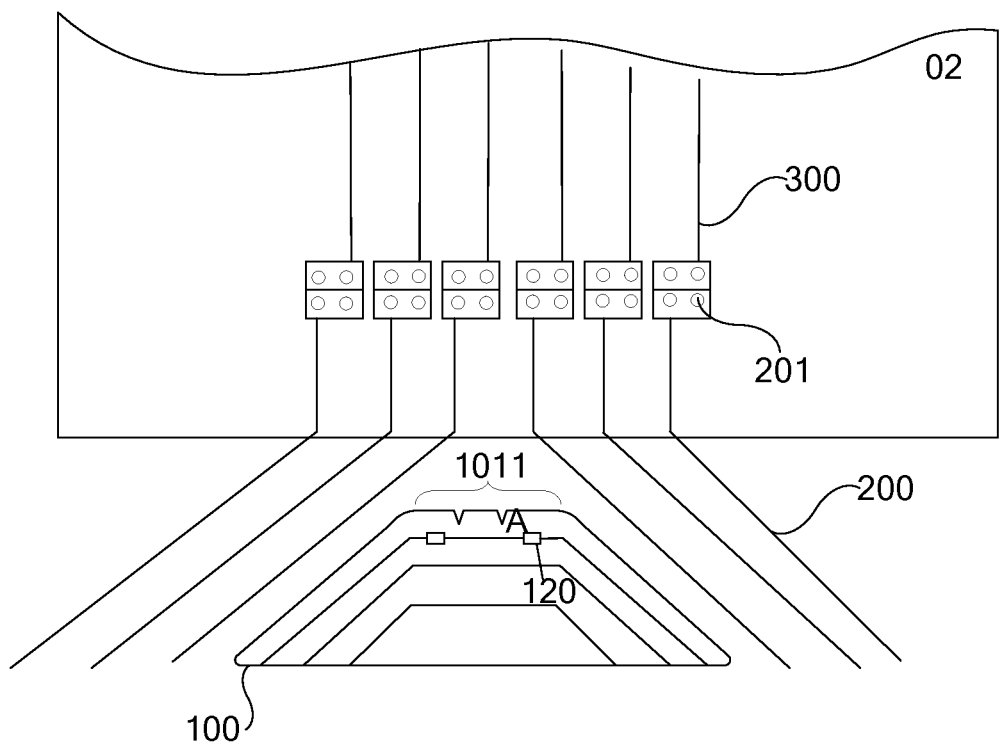
FIG. 9 is a schematic diagram showing a partial structure of yet another array substrate, in accordance with some embodiments of the present disclosure.

In some embodiments, as shown in FIG. 9, the signal line leads 200 are coupled to the signal lines 300 in the display region 02 of the array substrate through the transparent conductive materials (for example, the ITO) disposed in transfer holes 201.

With regard to this connection mode, if the auxiliary wiring structure in FIG. 2 is used, the point discharges will easily occur at the corner portions of the peripheral closed wiring loop, and the relatively large current generated at the moment when the point discharges occur will flow to the transfer holes 201 through the signal line leads 200, thereby causing that the transparent conductive material in the transfer hole 201 generates a large amount of heat and is burnt down, and then causing an abnormal display at a corresponding position on the display device including the array substrate.

In contrast, when some embodiments of the present disclosure adopt the technical solution as shown in FIG. 9, the point discharges are prevented from occurring at the corner portions through that the corner portions of the peripheral closed wiring loop 100 adopt the smooth connecting curve. Based on this, the electric charges are transferred to the interior wires 110 through providing the at least one tip A facing the interior wires 110 on the first peripheral wire 1011 and through the point discharge occurring at each tip A. Moreover, by coupling both ends of each first interior sub-wire 111 opposite to the first peripheral wire 1011 to the second interior sub-wires 112 through the conductive connecting portions 120 having a large resistivity, the electric charges are further consumed, so that a probability of adversely affecting the display region is significantly reduced.

Some embodiments of the present disclosure provide a display device, and the display device includes the array substrate. The display device has a same structure and same beneficial effects as the array substrate. Since the structure and beneficial effects of the array substrate have been described in detail above, details are not described herein again.

It will be noted that in some embodiments of the present disclosure, the display device includes one of a liquid crystal display panel and an organic light-emitting diode display panel. In some embodiments, the display device is any product or component having a display function such as a liquid crystal display, a liquid crystal television, a digital photo frame, a mobile phone, or a tablet computer.

The foregoing descriptions are merely some specific implementation manners of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. An array substrate, comprising a display region and a wiring region, wherein the wiring region includes a plurality of sets of signal line leads, and a same set of signal line leads extends to a corresponding bonding region disposed in the wiring region;
   the wiring region further includes auxiliary wiring structure(s) each disposed between adjacent two sets of signal line leads;
   each auxiliary wiring structure includes a peripheral closed wiring loop; the peripheral closed wiring loop includes at least one corner portion;
   a shape of all of the at least one corner portion of the peripheral closed wiring loop is a curved shape;
   the peripheral closed wiring loop includes at least three peripheral wires sequentially coupled; and
   each auxiliary wiring structure further includes interior wires disposed inside the peripheral closed wiring loop, and the peripheral closed wiring loop is provided with at least one tip facing the interior wires.

2. The array substrate according to claim 1, wherein the at least three peripheral wires of the peripheral closed wiring loop include a first peripheral wire proximate to the display region of the array substrate; and
   the first peripheral wire is provided with the at least one tip.

3. The array substrate according to claim 2, wherein the first peripheral wire is parallel to an arrangement direction of bonding regions.

4. The array substrate according to claim 3, wherein the at least three peripheral wires of the peripheral closed wiring loop are four peripheral wires;
   the four peripheral wires include a second peripheral wire disposed parallel to the first peripheral wire, and a third peripheral wire and a fourth peripheral wire disposed on two sides of the first peripheral wire and the second peripheral wire, and the third peripheral wire and the fourth peripheral wire are disposed opposite to each other; and
   the third peripheral wire is disposed parallel to a signal line lead of a set of signal line leads closest to the auxiliary wiring structure, the fourth peripheral wire is disposed parallel to a signal line lead of another set of signal line leads closest to the auxiliary wiring structure, and the two sets of signal line leads are proximate to each other.

5. The array substrate according to claim 4, wherein in the at least one peripheral closed wiring loop, a length of the first peripheral wire is less than a length of the second peripheral wire.

6. The array substrate according to claim 1, wherein the interior wires include at least one first interior wire;
   each first interior wire includes second interior sub-wire(s) directly connected to the peripheral closed wiring loop, and a first interior sub-wire disconnected from each second interior sub-wire; and the first interior sub-wire is disposed parallel to the first peripheral wire, and the first interior sub-wire is disposed at least directly opposite to at least a portion of the first peripheral wire where the at least one tip is disposed; and
   each first interior wire further includes at least one conductive connecting portion;
   in each first interior wire, the first interior sub-wire and a second interior sub-wire proximate to the first interior sub-wire are coupled through one conductive connecting portion.

7. The array substrate according to claim 6, wherein the first interior sub-wire of the first interior wire is disposed proximate to the first peripheral wire.

8. The array substrate according to claim 6, wherein the at least one first interior wire includes at least two second interior sub-wires, and in the first interior wire, one end of the first interior sub-wire is coupled to one second interior sub-wire through a conductive connecting portion, and another end of the first interior sub-wire is coupled to another second interior sub-wire through another conductive connecting portion.

9. The array substrate according to claim 6, wherein the at least one conductive connecting portion is mainly made of a transparent conductive material.

10. The array substrate according to claim 6, wherein a resistivity of at least one of the at least one conductive connecting portion is greater than a resistivity of the first interior wire.

11. A display device, comprising the array substrate according to claim 1.

12. The array substrate according to claim 1, wherein each tip is a protruding structure disposed on the peripheral closed wiring loop.

13. An array substrate, comprising a display region and a wiring region, wherein the wiring region includes a plurality of sets of signal line leads, and a same set of signal line leads extends to a corresponding bonding region disposed in the wiring region;
the wiring region further includes auxiliary wiring structure(s) each disposed between adjacent two sets of signal line leads;
each auxiliary wiring structure includes a peripheral closed wiring loop; the peripheral closed wiring loop includes at least one corner portion;
a shape of all of the at least one corner portion of the peripheral closed wiring loop is a curved shape;
the peripheral closed wiring loop includes at least three peripheral wires sequentially coupled; and
each auxiliary wiring structure further includes interior wires disposed inside the peripheral closed wiring loop, and the peripheral closed wiring loop includes at least one tip facing the interior wires.

14. The array substrate according to claim 13, wherein the at least three peripheral wires of the peripheral closed wiring loop include a first peripheral wire proximate to the display region of the array substrate; and
the first peripheral wire includes the at least one tip.

15. The array substrate according to claim 13, wherein the interior wires include at least one first interior wire;
each first interior wire includes second interior sub-wire (s) directly connected to the peripheral closed wiring loop, and a first interior sub-wire disconnected from each second interior sub-wire; and the first interior sub-wire is disposed parallel to the first peripheral wire, and the first interior sub-wire is disposed at least directly opposite to at least a tip of the first peripheral wire; and
each first interior wire further includes at least one conductive connecting portion;
in each first interior wire, the first interior sub-wire and a second interior sub-wire proximate to the first interior sub-wire are coupled through one conductive connecting portion.

16. The array substrate according to claim 13, wherein each tip is a bent structure of the peripheral closed wiring loop.

17. A display device, comprising the array substrate according to claim 13.

* * * * *